(12) United States Patent
Yuda et al.

(10) Patent No.: US 11,728,393 B2
(45) Date of Patent: Aug. 15, 2023

(54) SEMICONDUCTOR DEVICE

(71) Applicant: Mitsubishi Electric Corporation, Tokyo (JP)

(72) Inventors: Yohei Yuda, Tokyo (JP); Tatsuro Watahiki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 179 days.

(21) Appl. No.: 17/295,439

(22) PCT Filed: Mar. 13, 2019

(86) PCT No.: PCT/JP2019/010249
§ 371 (c)(1),
(2) Date: May 20, 2021

(87) PCT Pub. No.: WO2020/183645
PCT Pub. Date: Sep. 17, 2020

(65) Prior Publication Data
US 2021/0391428 A1 Dec. 16, 2021

(51) Int. Cl.
*H01L 29/24* (2006.01)
*H01L 29/06* (2006.01)
(Continued)

(52) U.S. Cl.
CPC ........ *H01L 29/247* (2013.01); *H01L 29/0619* (2013.01); *H01L 29/402* (2013.01);
(Continued)

(58) Field of Classification Search
CPC ... H01L 29/872; H01L 29/247; H01L 29/242; H01L 21/02513; H01L 21/02565
See application file for complete search history.

(56) References Cited

U.S. PATENT DOCUMENTS

2009/0174012 A1* 7/2009 Iwasaki ............... H01L 29/4908
257/410
2015/0325659 A1* 11/2015 Hitora .................... H01L 29/04
257/43
(Continued)

FOREIGN PATENT DOCUMENTS

WO 2018/004008 A1 1/2018

OTHER PUBLICATIONS

International Search Report and Written Opinion dated Jun. 11, 2019, received for PCT Application PCT/JP2019/010249, Filed on Mar. 13, 2019, 8 pages including English Translation.

*Primary Examiner* — Vincent Wall
(74) *Attorney, Agent, or Firm* — Xsensus LLP

(57) ABSTRACT

An object is to provide a technology that can enhance electrical characteristics of a semiconductor device. A semiconductor device is a semiconductor device provided with a semiconductor element. The semiconductor device includes: an n-type single-crystal gallium oxide layer including a first main surface; an electrode disposed on the first main surface of the n-type single-crystal gallium oxide layer or above the first main surface, the electrode being an electrode of the semiconductor element; a p-type oxide semiconductor layer disposed between the n-type single-crystal gallium oxide layer and the electrode; and an amorphous gallium oxide layer disposed between the n-type single-crystal gallium oxide layer and the p-type oxide semiconductor layer.

8 Claims, 5 Drawing Sheets

(51) Int. Cl.
*H01L 29/40* (2006.01)
*H01L 29/66* (2006.01)
*H01L 29/78* (2006.01)
*H01L 29/872* (2006.01)

(52) U.S. Cl.
CPC ........ *H01L 29/66969* (2013.01); *H01L 29/78* (2013.01); *H01L 29/872* (2013.01); *H01L 29/242* (2013.01)

(56) References Cited

U.S. PATENT DOCUMENTS

| | | |
|---|---|---|
| 2017/0179249 A1* | 6/2017 | Oda .................. H01L 21/02414 |
| 2017/0200790 A1* | 7/2017 | Hitora ................. H01L 29/7787 |
| 2018/0097079 A1* | 4/2018 | Utsumi ............... H01L 29/0623 |
| 2019/0157400 A1 | 5/2019 | Tanikawa et al. |
| 2019/0267237 A1* | 8/2019 | Yuda ....................... H01L 29/47 |
| 2020/0295203 A1* | 9/2020 | Watahiki ............... H01L 29/242 |
| 2021/0043778 A1* | 2/2021 | Lv ......................... H01L 29/872 |

* cited by examiner

SEMICONDUCTOR DEVICE

CROSS-REFERENCE TO RELATED APPLICATION

The present application is based on PCT filing PCT/JP2019/010249, filed Mar. 13, 2019, the entire contents of which are incorporated herein by reference.

TECHNICAL FIELD

The present invention relates to a semiconductor device.

BACKGROUND ART

Power electronics is a technology of promptly and efficiently performing conversion or the like of DC, AC, frequency, or the like of electricity. Power electronics is a technology combining electronics engineering and control engineering based on semiconductors of recent years in addition to conventional electric power engineering. Today, power electronics as described above is applied to nearly every field using electricity, such as for electric power use, industrial use, transportation use, and further, home use.

In recent years, the ratio of electric energy in whole energy consumption, specifically, the electrification ratio, shows a tendency of increasing not only in Japan but worldwide. One of the causes thereof is that devices excellent in convenience and power saving in terms of use of electricity have been developed in recent years, leading to increase in the use rate of electricity. The technology that lies at the base of these is the power electronics technology.

It can also be said that the power electronics technology is a technology of converting input to a device to be used into an electric state appropriate for the device, regardless of the electric state (for example, the magnitude of frequency, current, voltage, or the like) of a conversion target. The basic elements in the power electronics technology are rectifiers and inverters. In addition, elements that provide the base for the rectifiers and the inverters are semiconductors, such as diodes or transistors, which are put into practical use of semiconductors.

In the power electronics field of today, diodes being semiconductor rectifier elements are put into various uses, including electric devices. Further, diodes are used in frequency bands of wide ranges.

In recent years, transistors such as switching elements capable of operation with small loss and in high frequency have been developed and put into actual use for the use of high withstand voltage and large capacity. Further, materials used for semiconductor elements have shift to wide-gap materials, with the aim of achieving high withstand voltage of elements. Typical elements that are to achieve such high withstand voltage include Schottky barrier diodes (abbreviated as SBDs) and pn diodes (PNDs), and these diodes have been put into wide and various uses.

As an element using gallium oxide as a semiconductor layer, the SBD as described in Patent Document 1 is developed. In general, when a reverse voltage is applied to an SBD using a semiconductor material having high electrical breakdown strength, a leak current between an anode electrode and a semiconductor material layer is increased. As a countermeasure, by providing an electric field reduction structure at a termination portion of the anode electrode as in Patent Document 1, concentrated electric fields can be distributed and reduced, thus allowing for enhancement of reverse withstand voltage of the element.

PRIOR ART DOCUMENTS

Patent Documents

Patent Document 1: International Publication No. WO 2018/004008 A1

SUMMARY

Problem to be Solved by the Invention

The semiconductor device described in Patent Document 1 that uses gallium oxide has a guard ring structure and a field plate structure. According to such a structure as described above, enhancement of reverse voltage tolerance owing to the electric field reduction effect can be expected. However, in an oxide semiconductor device in which the p-n junction is formed by different types of oxide semiconductors made of semiconductor materials that are different from each other, it is in some cases difficult to stably form a p-n junction interface. In particular, such an unstable state of the p-n junction interface significantly affects electrical characteristics of elements.

In view of this, the present invention is made under the circumstances of the problems as described above, and has an object to provide a technology that can enhance electrical characteristics of a semiconductor device.

Means to Solve the Problem

A semiconductor device according to the present invention is a semiconductor device provided with a semiconductor element. The semiconductor device includes: an n-type single-crystal gallium oxide layer including a first main surface; an electrode disposed on the first main surface of the n-type single-crystal gallium oxide layer or above the first main surface, the electrode being an electrode of the semiconductor element; a p-type oxide semiconductor layer disposed between the n-type single-crystal gallium oxide layer and the electrode; and an amorphous gallium oxide layer disposed between the n-type single-crystal gallium oxide layer and the p-type oxide semiconductor layer.

Effects of the Invention

According to the present invention, the amorphous gallium oxide layer disposed between the n-type single-crystal gallium oxide layer and the p-type oxide semiconductor layer can be included, and therefore electrical characteristics of the semiconductor device can be enhanced.

These and other objects, features, aspects and advantages of the present invention will become more apparent from the following detailed description of the present invention when taken in conjunction with the accompanying drawings.

DESCRIPTION OF EMBODIMENTS

Embodiments of the present invention will be described below with reference to the accompanying drawings. Note that the drawings are schematically illustrated, and for the sake of convenience of description, components are omitted or components are simplified as appropriate. Further, sizes and relative relationships of positions of components and the like illustrated in different drawings are not necessarily illustrated accurately and may be changed as appropriate. Further, in the description provided below, similar constituent elements are denoted by the same reference signs in illustration, and the same holds true for terms and functions of the constituent elements. Thus, detailed description of similar constituent elements may be omitted in order to avoid redundancy.

First Embodiment

An oxide semiconductor device being a semiconductor device according to the first embodiment, and a manufacturing method of the oxide semiconductor device will be described below. First, a configuration of the oxide semiconductor device according to the first embodiment will be described.

Figure 1:
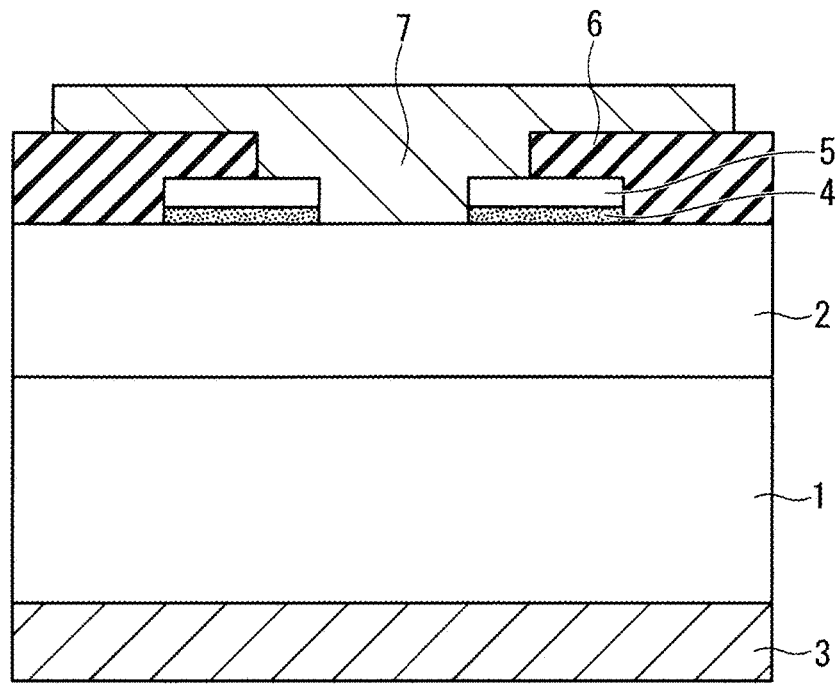
FIG. 1 is a cross-sectional diagram schematically illustrating a configuration of an oxide semiconductor device according to the first embodiment.

The oxide semiconductor device illustrated in FIG. 1 is a cross-sectional diagram schematically illustrating a structure of the oxide semiconductor device according to the first embodiment. In the semiconductor device according to the first embodiment, a p-type oxide semiconductor layer 5 and a field-plate dielectric layer 6 are each disposed in a termination structure of a Schottky barrier diode (SBD).

The following description will be given on the assumption that, in the oxide semiconductor device according to the first embodiment, the SBD including an anode electrode 7 being an electrode and a cathode electrode 3 are provided as semiconductor elements. However, the semiconductor element according to the first embodiment is not limited to the SBD, and may be another power device element or the like, such as a transistor as in the fourth embodiment.

The oxide semiconductor device illustrated in FIG. 1 includes an n-type single-crystal gallium oxide layer including an upper surface (first main surface) and a lower surface (second main surface) on the opposite side of the upper surface. The following will provide an example in which the n-type single-crystal gallium oxide layer includes an n-type single-crystal gallium oxide substrate 1 (n-type oxide semiconductor) and an n-type gallium oxide epitaxial growth layer 2 (n-type single-crystal gallium oxide epitaxial growth layer) being disposed on the n-type single-crystal gallium oxide substrate 1.

In this example, the n-type single-crystal gallium oxide substrate 1 includes the lower surface (second main surface) of the n-type single-crystal gallium oxide layer on the opposite side of the n-type gallium oxide epitaxial growth layer 2, and the n-type gallium oxide epitaxial growth layer 2 includes the upper surface (first main surface) of the n-type single-crystal gallium oxide layer on the opposite side of the n-type single-crystal gallium oxide substrate 1. However, the n-type single-crystal gallium oxide layer is not limited to this example, and may include, for example, one of the n-type single-crystal gallium oxide substrate 1 and the n-type gallium oxide epitaxial growth layer 2.

In the oxide semiconductor device illustrated in FIG. 1, the anode electrode 7 is disposed on the upper surface of the n-type gallium oxide epitaxial growth layer 2, and is in electrical contact with the upper surface in the form of Schottky junction. Further, in the oxide semiconductor device illustrated in FIG. 1, the cathode electrode 3 is disposed on the lower surface of the n-type single-crystal gallium oxide substrate 1, and is in electrical contact with the lower surface in the form of ohmic junction.

The oxide semiconductor device illustrated in FIG. 1 includes an element different from gallium (Ga) as its main component, and includes a p-type oxide semiconductor layer 5 having p-type conductivity. The p-type oxide semiconductor layer 5 is disposed between the n-type gallium oxide epitaxial growth layer 2 and the anode electrode 7, and the anode electrode 7 is in electrical contact with the p-type oxide semiconductor layer 5 in the form of ohmic junction. Note that the anode electrode 7 and the p-type oxide semiconductor layer 5 are partially separated apart from each other.

Further, the oxide semiconductor device illustrated in FIG. 1 includes an amorphous gallium oxide layer 4, which is disposed between the n-type gallium oxide epitaxial growth layer 2 and the p-type oxide semiconductor layer 5 and serves to divide these from each other. Note that, although the amorphous gallium oxide layer 4 is in direct contact with the n-type gallium oxide epitaxial growth layer 2 and the p-type oxide semiconductor layer 5, the amorphous gallium oxide layer 4 may be in indirect contact with the layers with a material interposed between the layers.

Amorphous gallium oxide does not have long-range order as that of crystals. Thus, the array of atoms of the amorphous gallium oxide layer 4 can be relatively easily matched to the lattice array of a layer to be joined to the amorphous gallium oxide layer 4. Owing to the amorphous gallium oxide layer 4 as described above, normality of the p-n junction between the n-type gallium oxide epitaxial growth layer 2 and the p-type oxide semiconductor layer 5, that is, the p-n junction obtained by materials having lattice constants different from each other, can be maintained. Accordingly, electrical characteristics of the oxide semiconductor device can be enhanced. Further, the n-type gallium oxide epitaxial growth layer 2 has the same plane orientation as the crystal plane orientation of the n-type single-crystal gallium oxide substrate 1. It is known that the n-type single-crystal gallium oxide is crystals having several plane orientations, and thermal conductivity and electrical conductivity thereof differ depending on each of the plane orientations. Disposition of the amorphous gallium oxide layer 4 at a p-n junction interface between the n-type gallium oxide epitaxial growth layer 2 and the p-type oxide semiconductor layer 5 allows for production of an element that is less liable to be subjected to restrictions of such plane orientations of the n-type gallium oxide epitaxial growth layer 2. Accordingly, it is expected that more options are provided for the plane orientation of the n-type single-crystal gallium oxide substrate 1 with respect to a target element.

The oxide semiconductor device illustrated in FIG. 1 includes a field-plate dielectric layer 6 being an insulation layer for a field plate, which is disposed between the p-type oxide semiconductor layer 5 and the anode electrode 7 and is disposed between the n-type gallium oxide epitaxial growth layer 2 and the anode electrode 7 in the termination structure. With the stacked part between the field-plate dielectric layer 6 and the anode electrode 7 constituting a field plate structure, an effect of increasing withstand voltage of the oxide semiconductor device when a reverse voltage is applied to the oxide semiconductor device can be expected.

Further, in the oxide semiconductor device illustrated in FIG. 1, a part of the p-type oxide semiconductor layer 5 is located on a termination side of the oxide semiconductor device with respect to a lower part of the anode electrode 7. According to such a configuration, the p-type oxide semiconductor layer 5 can be used as a guard ring of the SBD, and thus reverse withstand voltage of the SBD can be increased.

Next, the above-described constituent elements of the oxide semiconductor device will be described in further detail.

The n-type single-crystal gallium oxide substrate 1 is an n-type oxide semiconductor made of single crystals of $Ga_2O_3$, more preferably, an n-type oxide semiconductor made of single crystals of $\beta$-$Ga_2O_3$. The n-type single-crystal gallium oxide substrate 1 exhibits n-type conductivity due to oxygen deficiency in crystals, and may thus not contain n-type impurities, but may contain n-type impurities such as silicon (Si) or tin (Sn). Specifically, the n-type single-crystal gallium oxide substrate 1 may be any one of an n-type single-crystal gallium oxide substrate that exhibits n-type conductivity only with oxygen deficiency, an n-type single-crystal gallium oxide substrate that exhibits n-type conductivity only with n-type impurities, and an n-type single-crystal gallium oxide substrate that exhibits n-type conductivity with both of oxygen deficiency and n-type impurities.

Electron carrier concentration of the n-type single-crystal gallium oxide substrate 1 containing n-type impurities is total concentration of the oxygen deficiency and the n-type impurities. The electron carrier concentration of the n-type single-crystal gallium oxide substrate 1 is, for example, $1 \times 10E17$ cm$^{-3}$ or more and $1 \times 10E19$ cm$^{-3}$ or less. Further, in order to reduce contact resistance between the n-type single-crystal gallium oxide substrate 1 and the cathode electrode 3 and reduce electrical resistance of the oxide semiconductor device itself, impurity concentration of the n-type single-crystal gallium oxide substrate 1 may be concentration higher than the numerical value range shown above.

The n-type gallium oxide epitaxial growth layer 2 is disposed on the upper surface of the n-type single-crystal gallium oxide substrate 1. The n-type gallium oxide epitaxial growth layer 2 is an n-type oxide semiconductor made of single crystals of $Ga_2O_3$, more preferably, an n-type oxide semiconductor made of single crystals of $\beta$-$Ga_2O_3$. It is desirable that n-type electron carrier concentration of the n-type gallium oxide epitaxial growth layer 2 is lower than the concentration of the n-type single-crystal gallium oxide substrate 1, and may be, for example, $1 \times 10E15$ cm$^{-3}$ or more and $1 \times 10E17$ cm$^{-3}$ or less.

The cathode electrode 3 is disposed on the lower surface of the n-type single-crystal gallium oxide substrate 1. The cathode electrode 3 forms ohmic junction with the n-type single-crystal gallium oxide substrate 1, and thus it is preferable that the cathode electrode 3 be made of a metal material having a smaller work function than the work function of the n-type single-crystal gallium oxide substrate 1. Further, it is preferable that the cathode electrode 3 be made using such a metal material that reduces electrical contact resistance between the n-type single-crystal gallium oxide substrate 1 and the cathode electrode 3 due to thermal treatment after the cathode electrode 3 is formed on the lower surface of the n-type single-crystal gallium oxide substrate 1.

Examples of such a metal material may include titanium (Ti). Further, the cathode electrode 3 may be made by stacking a plurality of metal materials. For example, the cathode electrode 3 may be made by a stacked structure including a metal material in contact with the lower surface of the n-type single-crystal gallium oxide substrate 1, which is liable to be oxidized, and a metal material formed on the lower surface of the metal material, which is not liable to be oxidized. For example, the cathode electrode 3 may be made by disposing a first layer made of Ti in contact with the n-type single-crystal gallium oxide substrate 1 and then disposing a second layer made of gold (Au) on the lower surface of the first layer. Further, the cathode electrode 3 may be disposed on the entire lower surface of the n-type single-crystal gallium oxide substrate 1, or may be disposed partially on the lower surface of the n-type single-crystal gallium oxide substrate 1.

The amorphous gallium oxide layer 4 is a layer of an oxide semiconductor made of $Ga_2O_3$ having an amorphous structure. The amorphous gallium oxide layer 4 is an n-type oxide semiconductor exhibiting n-type conductivity. Note that it is desirable that impurity concentration of the amorphous gallium oxide layer 4 be approximately as high as that of the n-type gallium oxide epitaxial growth layer 2 described above.

The p-type oxide semiconductor layer 5 is disposed above the upper surface of the n-type gallium oxide epitaxial growth layer 2, with the amorphous gallium oxide layer 4 being interposed therebetween. The p-type oxide semiconductor layer 5 is made of a p-type oxide semiconductor that exhibits p-type conductivity without addition of p-type impurities, such as copper oxide (I) ($Cu_2O$), silver oxide ($Ag_2O$), nickel oxide (NiO), or tin oxide (SnO). For example, regarding $Cu_2O$ being a metal oxide, the 3d orbital of Cu forms a valence band upper end being crucial for hole conduction, and holes are generated due to Cu deficiency, and thus $Cu_2O$ exhibits p-type conductivity. Further, when $Cu_2O$ turns into CuO due to oxidation, it is considered that the 3d orbital of the Cu no longer forms the valence band upper end, eliminating p-type conductivity. The p-type oxide semiconductor layer 5 is made of a p-type oxide semiconductor that is made of a metal oxide having such property.

Although the p-type oxide semiconductor layer 5 is made of a p-type oxide semiconductor that exhibits p-type conductivity without addition of p-type impurities as described above, the p-type impurities may be added. For example, when the p-type oxide semiconductor layer 5 is made of $Cu_2O$, nitrogen (N) may be used as p-type impurities. When p-type impurities are not added, hole carrier concentration of the p-type oxide semiconductor layer 5 is concentration of metal atom deficiency of the p-type oxide semiconductor layer 5, whereas when p-type impurities are added, hole carrier concentration of the p-type oxide semiconductor layer 5 is total concentration of metal atom deficiency of the p-type oxide semiconductor layer 5 and p-type impurities.

When p-type impurities are added to the p-type oxide semiconductor layer 5, even when p-type conductivity is eliminated due to oxidation of metal oxide of the p-type oxide semiconductor, the whole p-type oxide semiconductor layer 5 may exhibit p-type conductivity owing to the p-type impurities. However, when the metal oxide of the p-type oxide semiconductor layer 5 is oxidized to eliminate its p-type conductivity, p-type conductivity of the whole p-type oxide semiconductor layer 5 is reduced, and thus it is preferable that the metal oxide of the p-type oxide semiconductor layer 5 be not oxidized.

Note that the crystal state of the p-type oxide semiconductor layer 5 is not to be limited, and may be, for example, any one of a single-crystal state, a polycrystalline state, a microcrystalline state, and an amorphous state.

The field-plate dielectric layer 6 is made of, for example, a material such as silicon dioxide ($SiO_2$) or aluminium oxide ($Al_2O_3$). These materials are materials having higher electrical breakdown field intensity than $Ga_2O_3$ constituting the n-type gallium oxide epitaxial growth layer 2. Layer thickness of the field-plate dielectric layer 6 may be approximately several hundreds of nanometers, and may be, for example, 100 nm or more and 500 nm or less. In order to increase reverse withstand voltage of the oxide semiconductor device, it is desirable to reduce or distribute electric fields concentrating on specific positions of the oxide semiconductor device when a reverse voltage is applied. The field-plate dielectric layer 6 is disposed to reduce such concentration points of the electric fields in the oxide semiconductor device. In order to further enhance the electric field reduction effect, it is desirable that the field-plate dielectric layer 6 has as thin film thickness as possible, and the film thickness may be, for example, thinner than the numerical value shown above.

The anode electrode 7 is disposed on the upper surface of the n-type gallium oxide epitaxial growth layer 2. The anode electrode 7 is in contact with the n-type gallium oxide epitaxial growth layer 2 in the form of Schottky junction, and thus it is preferable that the anode electrode 7 be made of a metal material having a larger work function than the work function of the n-type gallium oxide epitaxial growth layer 2. Further, the anode electrode 7 is in contact with the p-type oxide semiconductor layer 5 in the form of ohmic junction, and thus it is preferable that the anode electrode 7 be made of a metal material having a smaller work function than the work function of the p-type oxide semiconductor layer 5 (p-type oxide semiconductor material, for example, $Cu_2O$).

Examples of such a metal material may include platinum (Pt), nickel (Ni), gold (Au), and palladium (Pd). The anode electrode 7 may have a stacked structure similarly to the cathode electrode 3. For example, the anode electrode 7 may be made by disposing a first layer made of a metal material appropriate for Schottky junction with the n-type gallium oxide epitaxial growth layer 2 so as to be in contact with the n-type gallium oxide epitaxial growth layer 2, disposing a second layer made of another metal material on the upper surface of the first layer, and further disposing a third layer in order.

<Manufacturing Method>

Next, a manufacturing method of the oxide semiconductor device according to the first embodiment will be described.

Figure 2:
FIG. 2 is a cross-sectional diagram schematically illustrating a manufacturing method of the oxide semiconductor device according to the first embodiment.

First, as illustrated in FIG. 2, the n-type single-crystal gallium oxide substrate 1 is prepared. For the n-type single-crystal gallium oxide substrate 1, a substrate that is cut into a shape of the substrate off a single-crystal bulk of β-$Ga_2O_3$ produced with the crystal growth from melt method can be used.

Figure 3:
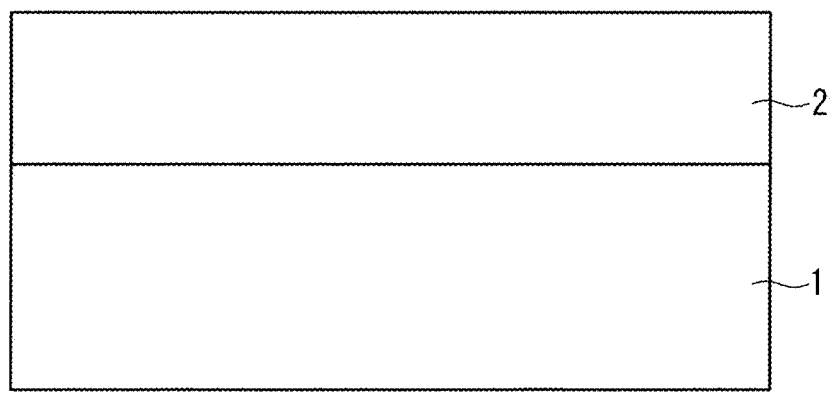
FIG. 3 is a cross-sectional diagram schematically illustrating the manufacturing method of the oxide semiconductor device according to the first embodiment.

Next, as illustrated in FIG. 3, the n-type gallium oxide epitaxial growth layer 2 is deposited on the upper surface of the n-type single-crystal gallium oxide substrate 1 through epitaxial growth. The n-type gallium oxide epitaxial growth layer 2 can be formed on the upper surface of the n-type single-crystal gallium oxide substrate 1 with a method such as the metal organic chemical vapor deposition (abbreviated as MOCVD) method, the molecular beam epitaxy (abbreviated as MBE) method, or the halide vapor phase epitaxy (abbreviated as HVPE) method.

Figure 4:
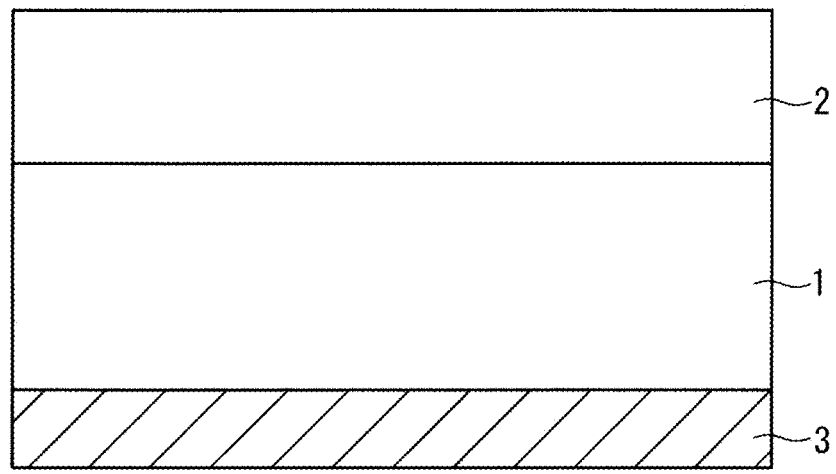
FIG. 4 is a cross-sectional diagram schematically illustrating the manufacturing method of the oxide semiconductor device according to the first embodiment.

Next, as illustrated in FIG. 4, a metal material to be the cathode electrode 3 is deposited on the lower surface of the n-type single-crystal gallium oxide substrate 1 with the vapor deposition method or the sputtering method. For example, the cathode electrode 3 having a double layer structure is formed by depositing a Ti layer on the lower surface of the n-type single-crystal gallium oxide substrate 1 so as to have a thickness of 100 nm with electron beam vapor deposition (EB vapor deposition), and then depositing an Ag layer on the lower surface of the Ti layer so as to have a thickness of 300 nm with electron beam vapor deposition. Subsequently, for example, thermal treatment is performed in a nitrogen atmosphere or an oxygen atmosphere at 550° C. for 5 minutes. As a result, the cathode electrode 3 in contact with the n-type single-crystal gallium oxide substrate 1 in the form of ohmic junction is formed on the lower surface of the n-type single-crystal gallium oxide substrate 1. Note that, in order to reduce contact resistance between the n-type single-crystal gallium oxide substrate 1 and the cathode electrode 3, etching treatment (reactive ion etching: abbreviated as RIE) using a gas such as boron trichloride ($BCl_3$) may be performed on the lower surface of the n-type single-crystal gallium oxide substrate 1, before the formation of the cathode electrode 3.

Figure 5:
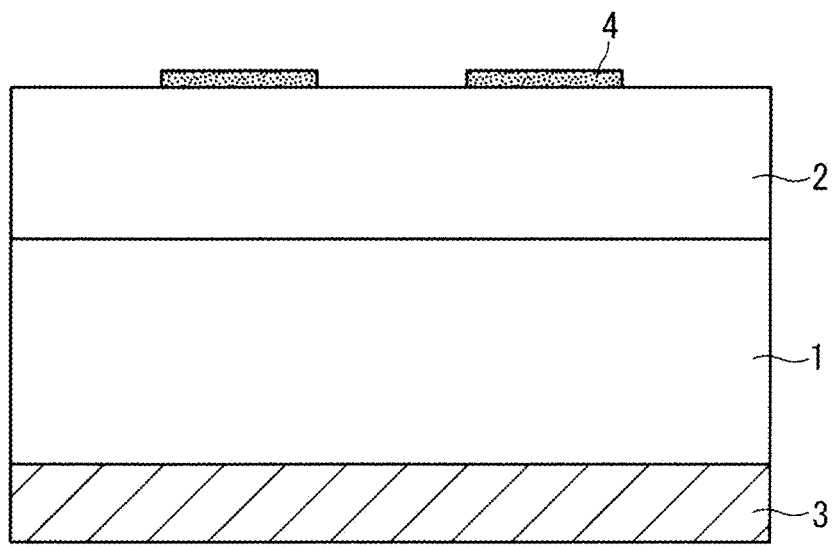
FIG. 5 is a cross-sectional diagram schematically illustrating the manufacturing method of the oxide semiconductor device according to the first embodiment.

Next, as illustrated in FIG. 5, the amorphous gallium oxide layer 4 is formed on the upper surface of the n-type gallium oxide epitaxial growth layer 2. As the formation method of the amorphous gallium oxide layer 4, there are two methods as described below.

The first method is a method in which the amorphous gallium oxide layer 4 having desired physical property is deposited and formed on the upper surface of the n-type gallium oxide epitaxial growth layer 2 by using a method such as the sputter method, the pulse laser deposition method (Pulse Laser Deposition: abbreviated as PLD), and the atomic layer deposition method (Atomic Layer Deposition: abbreviated as ALD). The formation method includes a method of performing formation through a lift-off process after a resist mask is formed using photolithography, and a method of performing formation through etching treatment after the amorphous gallium oxide layer 4 is formed on the entire upper surface of the n-type gallium oxide epitaxial growth layer 2.

The second method is a method in which amorphization is induced by disturbing the crystal state of the upper surface of the n-type gallium oxide epitaxial growth layer 2 by using wet treatment or dry treatment. In this case, the method includes a method of forming a resist mask using photolithography and then removing the resist after treatment for amorphization, and a method of performing formation through etching treatment after the entire upper surface of the n-type gallium oxide epitaxial growth layer 2 is amorphized.

Figure 6:
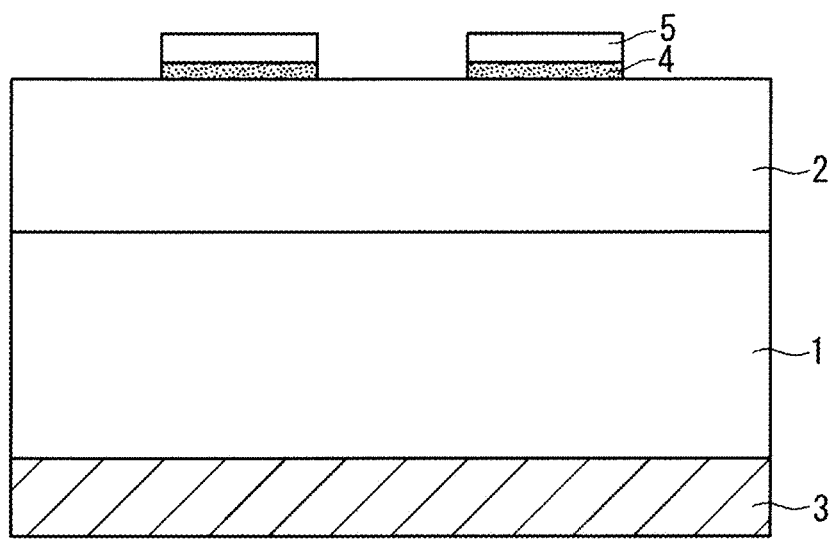
FIG. 6 is a cross-sectional diagram schematically illustrating the manufacturing method of the oxide semiconductor device according to the first embodiment.

Next, as illustrated in FIG. 6, the p-type oxide semiconductor layer 5 is formed on the upper surface of the amorphous gallium oxide layer 4 illustrated in FIG. 5. For example, a $Cu_2O$ film having p-type conductivity can be formed as the p-type oxide semiconductor layer 5 by adjusting oxygen partial pressure and nitrogen partial pressure in the sputter method using a Cu material as a raw material, but this is not restrictive. In addition, the p-type oxide semiconductor layer 5 can be formed through a lift-off process or an etching process for the $Cu_2O$ film.

Figure 7:
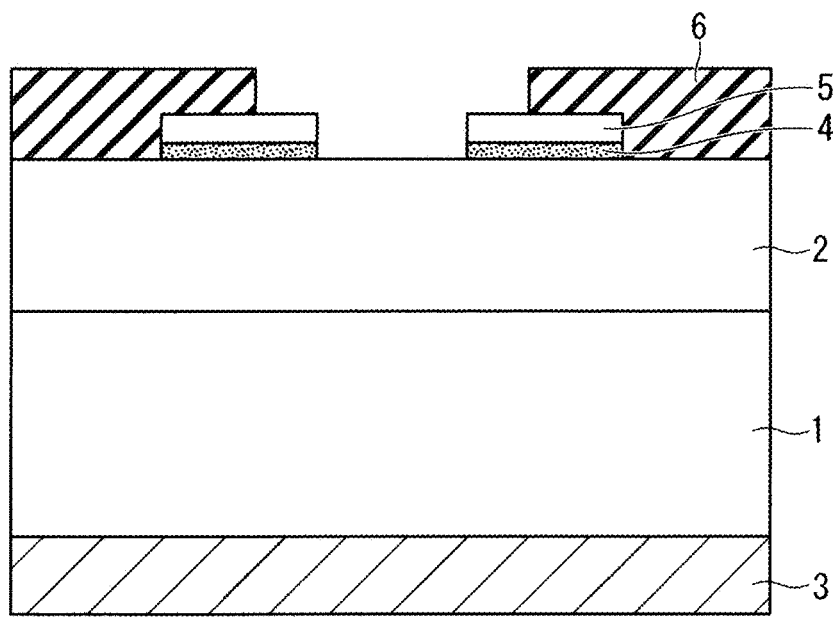
FIG. 7 is a cross-sectional diagram schematically illustrating the manufacturing method of the oxide semiconductor device according to the first embodiment.

Next, as illustrated in FIG. 7, the field-plate dielectric layer 6 is formed on the n-type gallium oxide epitaxial growth layer 2 and the p-type oxide semiconductor layer 5 in the termination structure. For example, as a method of forming an $SiO_2$ film as the field-plate dielectric layer 6, the spin-on glass (abbreviated as SOG) method, the CVD method in which tetraethyl orthosilicate (abbreviated as TEOS) being an organic source is used as a raw material, or the like is used.

Figure 8:
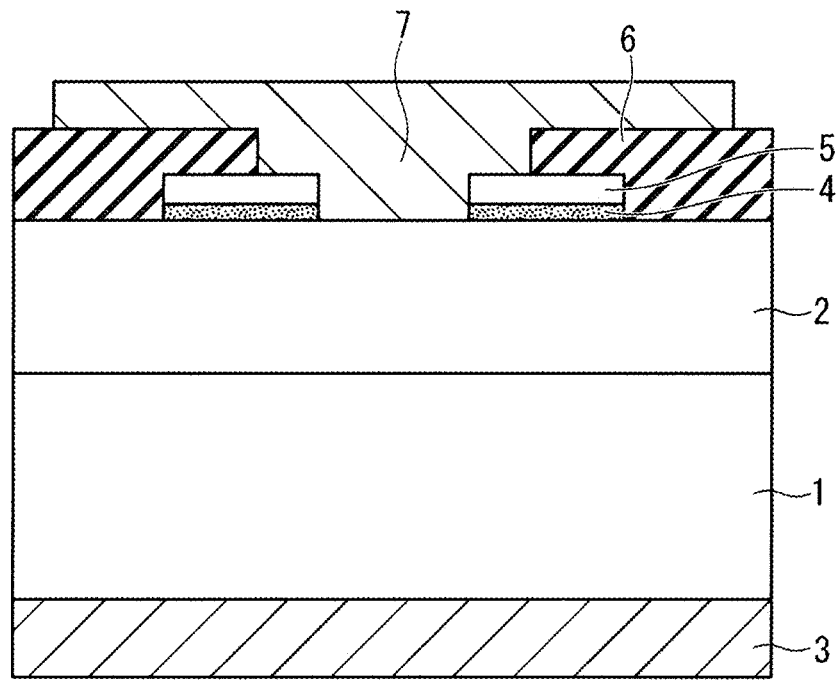
FIG. 8 is a cross-sectional diagram schematically illustrating the manufacturing method of the oxide semiconductor device according to the first embodiment.

Finally, as illustrated in FIG. 8 (FIG. 8 is a diagram similar to FIG. 1), the anode electrode 7 is formed on the n-type gallium oxide epitaxial growth layer 2 and the p-type oxide semiconductor layer 5 that are exposed from the field-plate dielectric layer 6, and the field-plate dielectric layer 6. A formation method of the anode electrode 7 is not specifically limited, and for example, a vapor deposition method of depositing a metal material is used. As one example thereof, the anode electrode 7 having a triple layer structure may be formed by depositing a Pt layer on the upper surface of the n-type gallium oxide epitaxial growth layer 2 so as to have a thickness of 50 nm with electron beam vapor deposition (EB vapor deposition), depositing a Ti layer on the Pt layer so as to have a thickness of 100 nm with electron beam vapor deposition, and then depositing an Au layer on the Ti layer so as to have a thickness of 300 nm with electron beam vapor deposition. In this manner, the oxide semiconductor device according to the first embodiment is completed.

Second Embodiment

Figure 9:
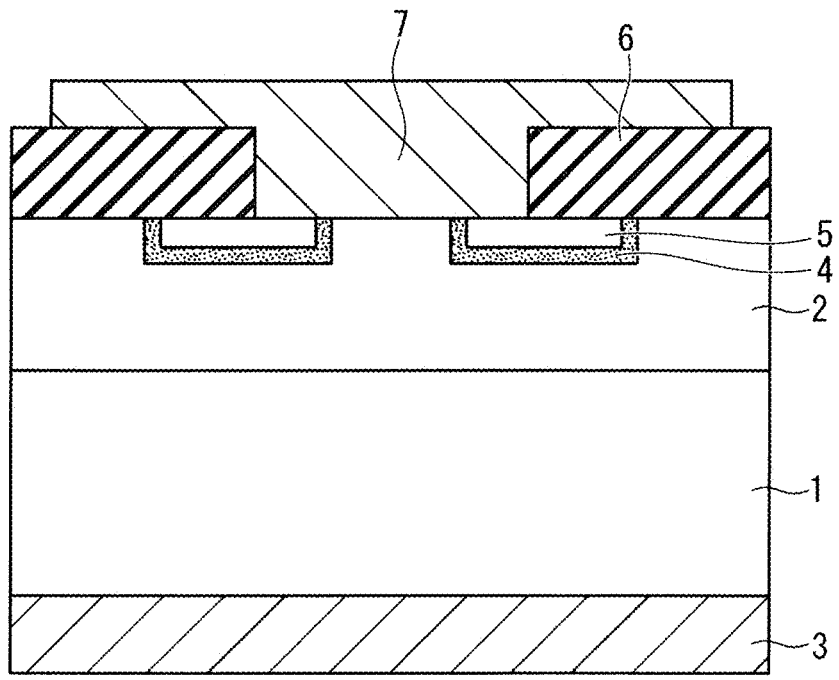
FIG. 9 is a cross-sectional diagram schematically illustrating a configuration of an oxide semiconductor device according to the second embodiment.

FIG. 9 is a cross-sectional diagram schematically illustrating a configuration of an oxide semiconductor device according to the second embodiment of the present invention. Note that the oxide semiconductor device according to the second embodiment and the oxide semiconductor device described in the first embodiment have a difference in whether the p-type oxide semiconductor layer 5 used for the termination structure is disposed on the upper surface of the n-type gallium oxide epitaxial growth layer 2 or is embedded inside through the upper surface.

In the second embodiment, a recess portion such as a trench is provided at an end portion of a region in contact with the anode electrode 7 out of the upper surface of the n-type gallium oxide epitaxial growth layer 2. Further, the p-type oxide semiconductor layer 5 is disposed in the recess portion, and the p-type oxide semiconductor layer 5 and the n-type gallium oxide epitaxial growth layer 2 form hetero junction. Note that, between the embedded p-type oxide semiconductor layer 5 and the n-type gallium oxide epitaxial growth layer 2, the amorphous gallium oxide layer 4 is disposed in a manner similar to the first embodiment. The recess portion such as a trench can be, for example, formed on the n-type gallium oxide epitaxial growth layer 2 by using the dry etching method using a gas such as $BCl_3$. However, the formation method of the recess portion is not specifically limited. Note that the manufacturing method of a part other than the recess portion of the oxide semiconductor device according to the second embodiment is the same as the manufacturing method of the oxide semiconductor device according to the first embodiment.

In the oxide semiconductor device according to the second embodiment described above as well, electrical characteristics of the oxide semiconductor device can be enhanced similarly to the first embodiment.

Third Embodiment

Figure 10:
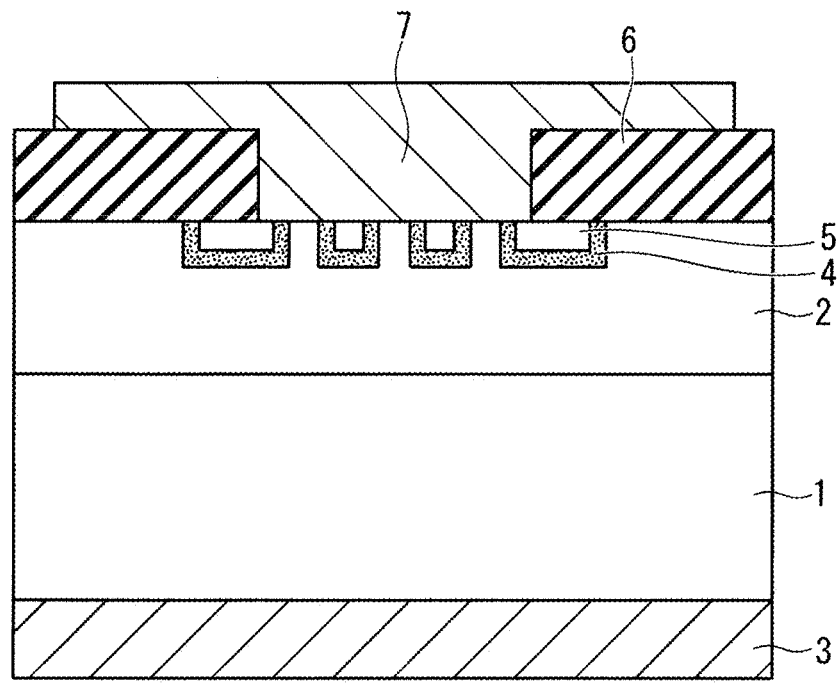
FIG. 10 is a cross-sectional diagram schematically illustrating a configuration of an oxide semiconductor device according to the third embodiment.

FIG. 10 is a cross-sectional diagram schematically illustrating a configuration of an oxide semiconductor device according to the third embodiment of the present invention. Note that the manufacturing method of the oxide semiconductor device according to the third embodiment is the same as the manufacturing method of the oxide semiconductor device according to the second embodiment.

In the oxide semiconductor device according to the second embodiment (FIG. 9), generally, the p-type oxide semiconductor layer 5 is disposed in the termination structure as a guard ring. In the oxide semiconductor device according to the third embodiment (FIG. 10), a plurality of p-type oxide semiconductor layers 5 are disposed in the termination structure as well as in an element part.

In other words, in the third embodiment, the recess portion such as a trench is provided not only in the end portion but also inside of the region in contact with the anode electrode 7 out of the upper surface of the n-type gallium oxide epitaxial growth layer 2. Further, the p-type oxide semiconductor layers 5 are disposed in the recess portion, and the p-type oxide semiconductor layers 5 and the n-type gallium oxide epitaxial growth layer 2 form hetero junction.

To express the above configuration in another way, the plurality of p-type oxide semiconductor layers 5 separated from each other are embedded in the upper surface of the n-type gallium oxide epitaxial growth layer 2 exposed from the field-plate dielectric layer 6. Further, between the p-type oxide semiconductor layers 5 disposed in the element part and the n-type gallium oxide epitaxial growth layer 2 as well, the amorphous gallium oxide layer 4 is disposed.

In the third embodiment configured as described above, a merged PiN Schottky (MPS) structure combining the p-n junction and the Schottky junction is disposed. According to the MPS structure, an effect of allowing a flow of a large surge current greater than a rated value with a small voltage drop through bipolar operation of the PND can be further enhanced than the SBD by itself. Therefore, according to the oxide semiconductor device having the MPS structure as in the third embodiment, forward surge tolerance is improved. With this configuration, the semiconductor device with reduced increase of a forward voltage drop and having a high rectification function of forward surge tolerance can be implemented. Further, as compared to the normal SBD, in a case of reverse voltage application, a depletion layer more easily spreads in a direction perpendicular to the current direction, and thus an enhancement effect of the withstand voltage can be expected.

Fourth Embodiment

Figure 11:
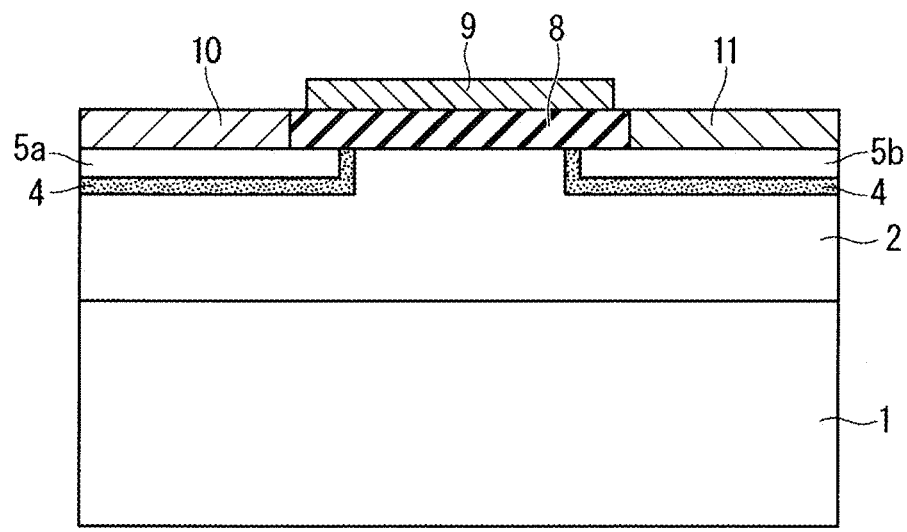
FIG. 11 is a cross-sectional diagram schematically illustrating a configuration of an oxide semiconductor device according to the fourth embodiment.

FIG. 11 is a cross-sectional diagram schematically illustrating a configuration of an oxide semiconductor device according to the fourth embodiment of the present invention. The semiconductor element provided in the oxide semiconductor device according to the fourth embodiment is not a diode described in the first to third embodiments described above, but is a transistor.

The oxide semiconductor device according to the fourth embodiment includes, as an electrode, a gate electrode 9 disposed above the upper surface of the n-type gallium oxide epitaxial growth layer 2, instead of the anode electrode 7. Further, the oxide semiconductor device according to the fourth embodiment includes, as a p-type oxide semiconductor layer, a first p-type oxide semiconductor layer 5a and a second p-type oxide semiconductor layer 5b that are separated apart from each other by the n-type gallium oxide epitaxial growth layer 2 under the gate electrode 9.

A gate insulation film 8 is disposed between the gate electrode 9 and the n-type gallium oxide epitaxial growth layer 2 under the gate electrode 9. A source electrode 10 is joined to the first p-type oxide semiconductor layer 5a, and a drain electrode 11 is joined to the second p-type oxide semiconductor layer 5b. Note that the source electrode 10 may be either directly or indirectly joined to the first p-type oxide semiconductor layer 5a. Similarly, the drain electrode 11 may be either directly or indirectly joined to the second p-type oxide semiconductor layer 5b.

The oxide semiconductor device according to the fourth embodiment is a horizontal element, and is thus slightly different from the oxide semiconductor device according to the first to third embodiments being a vertical element. However, the manufacturing method such as a film formation method of each part is the same as that of the oxide semiconductor device according to the first to third embodiments. Note that a material of the gate insulation film 8 is not specifically limited, and a general insulator such as $Al_2O_3$ and $SiO_2$ can be used. Further, materials of the source electrode 10 and the drain electrode 11 are not specifically limited as long as metal that can have contact with the p-type oxide semiconductor layer 5 in the form of ohmic junction is used.

In the oxide semiconductor device according to the fourth embodiment above as well, electrical characteristics of the oxide semiconductor device can be enhanced similarly to the first embodiment.

Note that, in the present invention, each embodiment can be freely combined, and each embodiment can be modified or omitted as appropriate within the scope of the invention.

While the invention has been shown and described in detail, the foregoing description is in all aspects illustrative and not restrictive. It is therefore understood that numerous unillustrated modifications can be devised without departing from the scope of the present invention.

EXPLANATION OF REFERENCE SIGNS

1 N-type single-crystal gallium oxide substrate, 2 N-type gallium oxide epitaxial growth layer, 3 Cathode electrode, 4 Amorphous gallium oxide layer, 5 P-type oxide semiconductor layer, 5a First p-type oxide semiconductor layer, 5b Second p-type oxide semiconductor layer, 6 Field-plate dielectric layer, 7 Anode electrode, 8 Gate insulation film, 9 Gate electrode, 10 Source electrode, 11 Drain electrode

The invention claimed is:

1. A semiconductor device provided with a semiconductor element, the semiconductor device comprising:
    an n-type single-crystal gallium oxide layer including a first main surface;
    an electrode disposed on the first main surface of the n-type single-crystal gallium oxide layer or above the first main surface, the electrode being an electrode of the semiconductor element;
    a p-type oxide semiconductor layer disposed between the n-type single-crystal gallium oxide layer and the electrode; and
    an amorphous gallium oxide layer disposed between the n-type single-crystal gallium oxide layer and the p-type oxide semiconductor layer.

2. The semiconductor device according to claim 1, wherein
    the n-type single-crystal gallium oxide layer includes
        an n-type single-crystal gallium oxide substrate, and
        an n-type single-crystal gallium oxide epitaxial growth layer being disposed on the n-type single-crystal gallium oxide substrate and including the first main surface on an opposite side of the n-type single-crystal gallium oxide substrate.

3. The semiconductor device according to claim 1, wherein
    the electrode includes an anode electrode in contact with the first main surface of the n-type single-crystal gallium oxide layer in a form of Schottky junction and in contact with the p-type oxide semiconductor layer in a form of ohmic junction, and
    the semiconductor device further comprises a cathode electrode in contact with a second main surface on an opposite side of the first main surface of the n-type single-crystal gallium oxide layer in a form of ohmic junction.

4. The semiconductor device according to claim 3, wherein
    the anode electrode and the p-type oxide semiconductor layer are partially separated apart from each other, and
    the semiconductor device further comprises a field-plate insulation layer disposed between the p-type oxide semiconductor layer and the anode electrode.

5. The semiconductor device according to claim 3, wherein
    a part of the p-type oxide semiconductor layer is located on a termination side of the semiconductor device with respect to a lower part of the anode electrode.

6. The semiconductor device according to claim 3, wherein
    a recess portion is provided in a region in contact with the anode electrode out of the first main surface,
    the p-type oxide semiconductor layer is disposed in the recess portion, and
    the p-type oxide semiconductor layer and the n-type single-crystal gallium oxide layer form hetero junction.

7. The semiconductor device according to claim 1, wherein
    the electrode includes a gate electrode disposed above the first main surface,
    the p-type oxide semiconductor layer includes a first p-type oxide semiconductor layer and a second p-type oxide semiconductor layer being separated apart from each other by the n-type single-crystal gallium oxide layer under the gate electrode, the semiconductor device further comprises
- a gate insulation film disposed between the gate electrode and the n-type single-crystal gallium oxide layer under the gate electrode,
- a source electrode joined to the first p-type oxide semiconductor layer, and
- a drain electrode joined to the second p-type oxide semiconductor layer.

8. The semiconductor device according to claim 1, wherein the p-type oxide semiconductor layer includes oxide containing copper or nickel.

* * * * *